US008928110B2

United States Patent
Lien et al.

(10) Patent No.: US 8,928,110 B2
(45) Date of Patent: Jan. 6, 2015

(54) DUMMY CELL PATTERN FOR IMPROVING DEVICE THERMAL UNIFORMITY

(75) Inventors: Wai-Yi Lien, Hsinchu (TW); Yu-Ho Chiang, Taichung (TW); Tsung-Yen Pan, Ping-Tung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 438 days.

(21) Appl. No.: 13/228,451

(22) Filed: Sep. 9, 2011

(65) Prior Publication Data

US 2013/0062707 A1    Mar. 14, 2013

(51) Int. Cl.
  *H01L 21/70* (2006.01)
  *H01L 27/02* (2006.01)
  *H01L 21/762* (2006.01)

(52) U.S. Cl.
  CPC ........ *H01L 27/0211* (2013.01); *H01L 27/0207* (2013.01); *H01L 21/76229* (2013.01)
  USPC .................... 257/506; 257/368; 257/E27.009

(58) Field of Classification Search
  USPC ................... 257/499, 509, 368, 401, E27.009
  See application file for complete search history.

(56) References Cited

U.S. PATENT DOCUMENTS

| | | | |
|---|---|---|---|
| 5,900,735 A | 5/1999 | Yamamoto | |
| 6,323,113 B1 | 11/2001 | Gabriel | |
| 7,174,532 B2 * | 2/2007 | Chlipala et al. | 716/53 |
| 7,617,475 B2 | 11/2009 | Lin | |
| 8,618,610 B2 * | 12/2013 | Wang et al. | 257/368 |
| 2002/0079584 A1 | 6/2002 | Matsunaga | |
| 2008/0042271 A1 | 2/2008 | Dauksher | |
| 2010/0052065 A1 * | 3/2010 | Diaz et al. | 257/369 |
| 2011/0156149 A1 * | 6/2011 | Wang et al. | 257/368 |

* cited by examiner

*Primary Examiner* — Laura Menz
*Assistant Examiner* — Candice Y Chan
(74) *Attorney, Agent, or Firm* — Winston Hsu; Scott Margo

(57) ABSTRACT

A dummy cell pattern includes a dummy diffusion pattern disposed within a predetermined region A; a trench isolation pattern encompassing the dummy diffusion pattern in the predetermined region A; a first dummy gate pattern disposed on the dummy diffusion pattern with two ends of the first dummy gate pattern extending above the trench isolation pattern, thereby forming overlapping areas C1 and C2; and a second dummy gate pattern directly on the trench isolation pattern forming an overlapping area C therebetween, wherein the combination of C1, C2 and C is about 5%-20% of the predetermined region A.

10 Claims, 4 Drawing Sheets

DUMMY CELL PATTERN FOR IMPROVING DEVICE THERMAL UNIFORMITY

BACKGROUND OF THE INVENTION

1. Field of the Invention

The present invention relates generally to the filed of semiconductor fabrication. More particularly, the present invention relates to a dummy cell pattern for filling a field between functional circuit blocks within a die. The invention is capable of unifying device performance, specifically in terms of ON current ($I_{ON}$) range between MOS transistors, within an integrated circuit die.

2. Description of the Prior Art

As known in the art, in semiconductor wafer fabrication, a rapid thermal anneal (RTA) process is often used to activate dopants, diffuse dopants, re-crystalize structures, etc. RTA processes are typically performed by utilizing halogen lamp-based heating equipment or lasers which direct radiation onto a wafer surface in order to change the wafer temperature.

During performance of these RTA processes, temperature variations occur at different points or areas within the integrated circuit die. Temperature variations within a die are due primarily to differences in thermal absorption and emission caused by different film stacks at different locations. As device dimensions shrink, the impact of these temperature variations has an increased effect on device performance by affecting electrical response or behavior at different locations within a die. Variations in device performance within a die have been observed and are attributed to temperature non-uniformity when the wafer (and its dies) undergoes front-side annealing schemes. These temperature variations not only result from differences in film stack materials, but also result from the pattern density across the die.

In semiconductor processing, dummy fill patterns have been used in diffusion mask and/or gate mask to prevent dishing effects from chemical-mechanical polishing (CMP) and to minimize the effects of device-to-device variations in pattern density. For example, in conventional shallow trench isolation processes, diffusion islands are isolated by oxide filled trenches. The formation of the shallow trench involves etching of the silicon trench patterns into a silicon substrate and subsequently filling the trenches with a thick oxide layer. The oxide layer is then planarized by using processes such as CMP, resist etchback, or oxide etchback processes. In these cases, the polish rate or etch rate is a function of the pattern density, which is defined as the percentage of the area that is occupied by diffusion patterns.

In order to ensure a uniform removal of the oxide over an entire wafer or substrate, the pattern density should ideally remain relatively the same over all areas. To achieve the relatively uniform pattern density, the field on the semiconductor substrate is often filled with dummy diffusion patterns. After filling with the dummy fill patterns, circuit areas and the field areas on the semiconductor substrate will have relatively similar pattern densities. However, the conventional dummy fill patterns deteriorate the variations in device performance within a die.

A semiconductor chip is typically formed by integrating up to millions or billions of transistors onto a single chip of semiconductor material. The uniformity of these transistors is generally of critical importance in the manufacturing of IC circuits. There is still a need for an improved fabrication process or method that is capable of unifying device performance and/or reducing temperature variations within an integrated circuit die.

SUMMARY OF THE INVENTION

It is one objective of the present invention to provide an improved dummy cell pattern for filling a field between functional circuit blocks within a die, which is capable of unifying device performance, specifically in terms of ON current ($I_{ON}$) range between MOS transistors, within the die.

According to one embodiment of this invention, a dummy cell pattern includes a dummy diffusion pattern disposed within a predetermined region A; a trench isolation pattern encompassing the dummy diffusion pattern in the predetermined region A; a first dummy gate pattern disposed on the dummy diffusion pattern with two ends of the first dummy gate pattern extending above the trench isolation pattern, thereby forming overlapping areas C1 and C2; and a second dummy gate pattern directly on the trench isolation pattern forming an overlapping area C therebetween, wherein the combination of C1, C2 and C is about 5%-20% of the predetermined region A.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
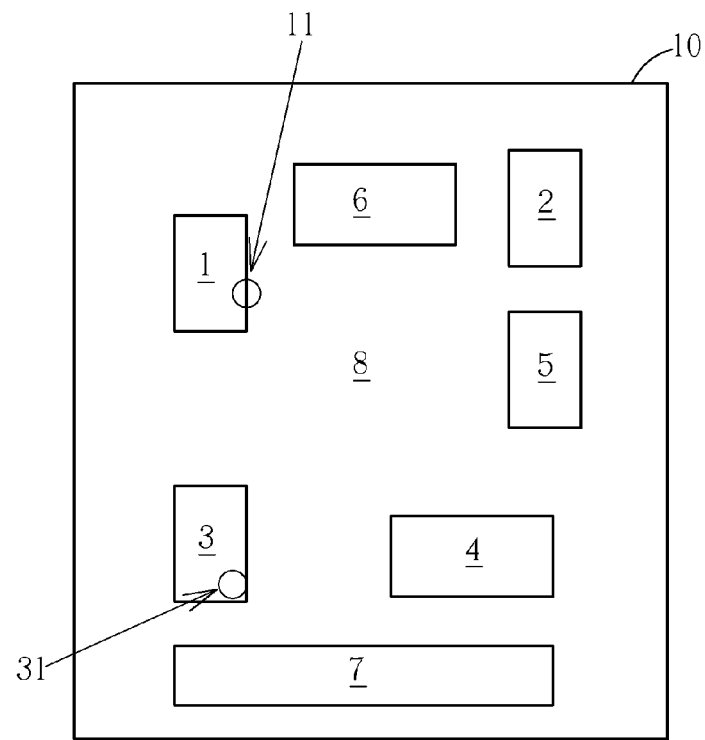
FIG. 1 is a top view of an integrated circuit die schematically showing the large ON current ($I_{ON}$) range.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

FIG. 1 is a schematic top view of an integrated circuit die 10. The integrated circuit die 10 may comprises a plurality of functional circuit blocks 1-7 including but not limited to, for example, core circuits, peripheral circuits, logic circuits, analog circuits, memory circuits, etc. An open field 8 is provided between the functional circuit blocks 1-7. As previously described, dummy fill structures or patterns may be provided within the open field 8 in diffusion mask and/or gate mask to prevent dishing effects from CMP and to minimize the effects of device-to-device variations in pattern density. However, these conventional dummy fill patterns deteriorate the variations in device performance, specifically in terms of ON current ($I_{ON}$) range, within the integrated circuit die 10. Hereinafter, the term "ON current ($I_{ON}$) range", or "$I_{ON}$ range" in short, refers to the maximum difference in the ON currents of the transistors across the die.

Stilling referring to FIG. 1, the applicants have experimentally found that after treated by RTA or RTP, a large ON current ($I_{ON}$) range occurs between the transistors disposed at different points or locations of the integrated circuit die 10, for example, between points indicated by arrows 11 and 31 in the respective functional circuit blocks 1 and 3. According to the experimental results, by way of example, the ON current of an NMOSFET may be somewhere between 891.4-911.4 µA/µm at the point indicated by arrow 11, while the ON current of an NMOSFET may be somewhere between 606.3.4-639.0 µA/µm at the point indicated by arrow 31. The large $I_{ON}$ range within a die has adversely and significantly affected the device performance as device dimensions shrink. The present invention addresses this issue.

Figure 2:
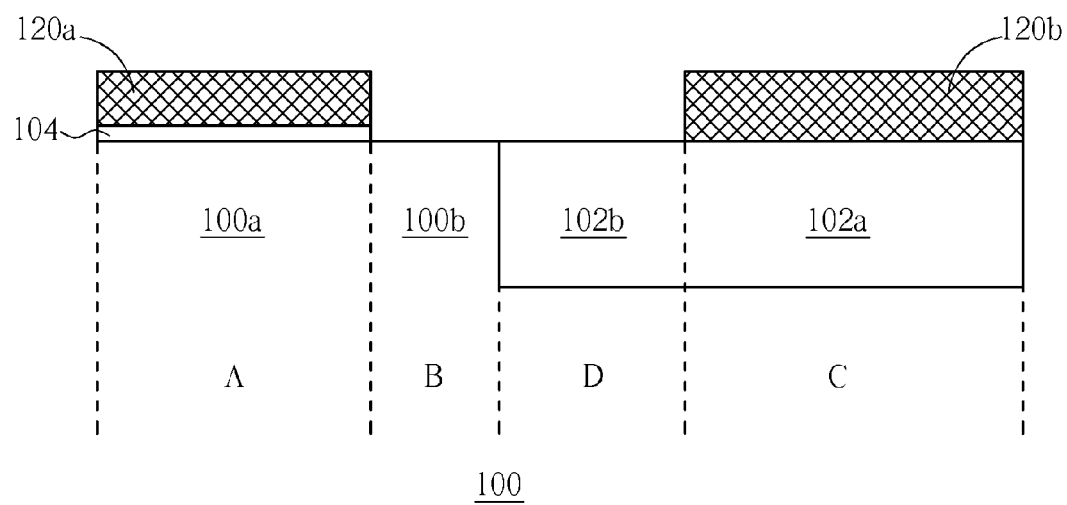
FIG. 2 is a schematic, cross-sectional diagram showing different types of the dummy fill patterns according to the embodiments of this invention.

FIG. 2 is a schematic, cross-sectional diagram showing different types of the dummy fill patterns according to the embodiments of this invention. As shown in FIG. 2, in order to access and analyze the impact of the dummy fill patterns on device performance, specifically the $I_{ON}$ range, within a die, the applicants have sorted out four general types of dummy fill patterns. The four types of dummy fill patterns (Types A-D) are formed on or in the semiconductor substrate 100. The dummy fill pattern Type A is defined as a first gate layer 120a such as polysilicon masking a first diffusion dummy pattern 100a with an insulating layer 104 interposed therebetween. The dummy fill pattern Type B is defined as a second diffusion dummy pattern 100b not masked by any gate layer. The dummy fill pattern Type C is defined as a second gate layer 120b masking a first STI pattern 102a. The dummy fill pattern Type D is defined as a second STI pattern 102b not masked by any gate layer. For the sake of simplicity, the aforesaid four types of dummy fill patterns (Types A-D) may be summarized as follows.

Type A (or Mask A): Dummy fill structure with poly dummy gate pattern directly on Si dummy diffusion pattern.

Type B (or Mask B): Dummy fill structure without poly dummy gate pattern directly on Si dummy diffusion pattern.

Type C (or Mask C): Dummy fill structure with poly gate pattern directly on STI.

Type D (or Mask D): Dummy fill structure without poly dummy gate pattern directly on STI.

According to the experiment results, the applicants have found that the dummy fill pattern Type C (or Mask C) is responsible for the large $I_{ON}$ range within a die. That is, the higher percentage the dummy fill pattern Type C occupies within a die, the larger the $I_{ON}$ range is. Reflectivity test of each of the aforesaid four types of dummy fill patterns is also performed. The reflectivity test is performed within an RTA or RTP chamber with ellisometer lamp (wavelength: 810 nm) as heating source. Test structure wafers each having respective dummy fill pattern types are treated with standard RTA process. According to the experimental results, Type A (or Mask A) has a reflectivity of about 0.35, Type B (or Mask B) has a reflectivity of about 0.31, Type C (or Mask C) has a reflectivity of about 0.61, and Type D (or Mask D) has a reflectivity of about 0.29. Compared to Types A, B and D (average 0.32), Type C has abnormal higher reflectivity (0.61).

Figure 3:
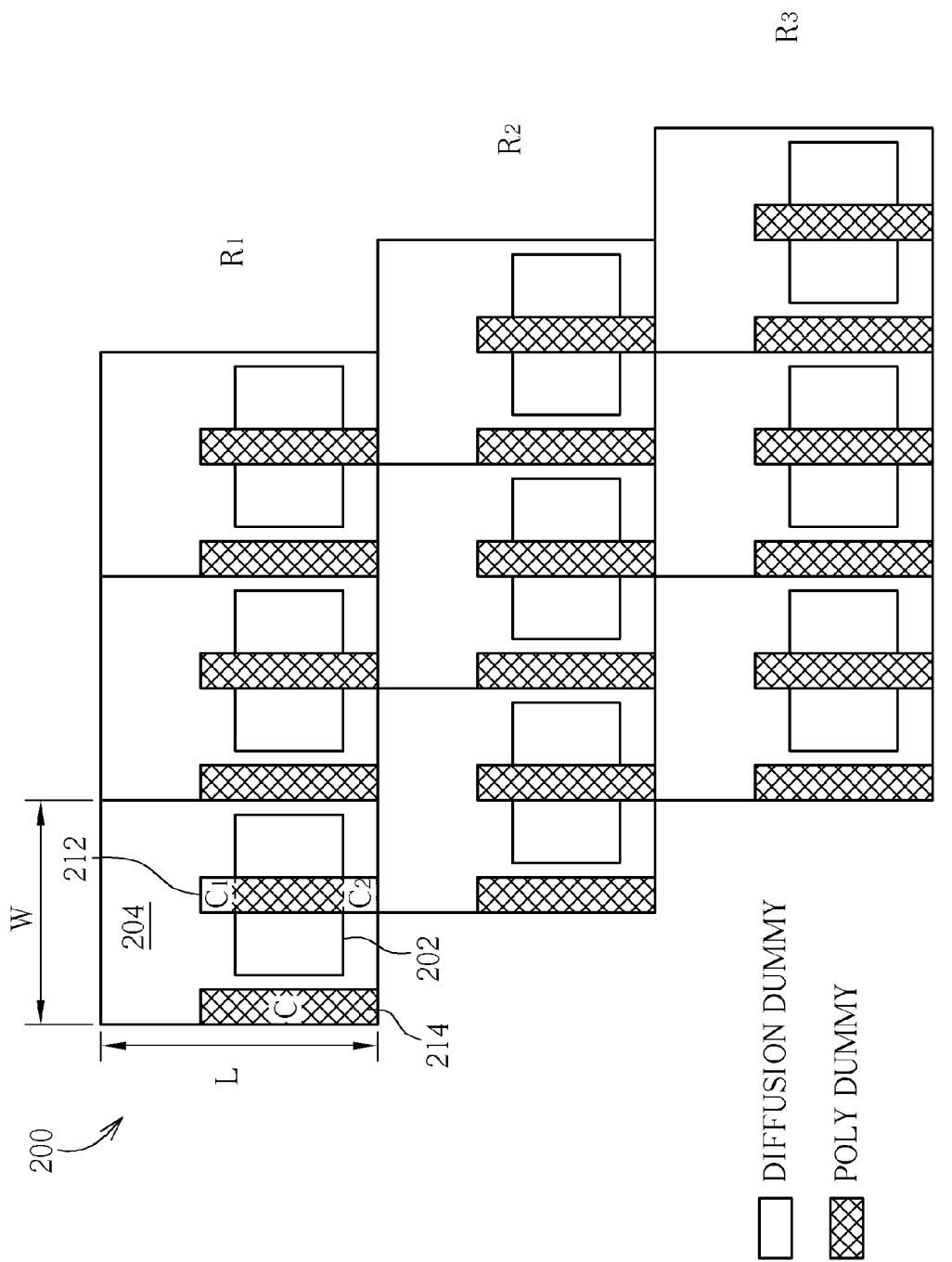
FIG. 3 is a schematic diagram showing an exemplary layout of the dummy cell pattern in accordance with one embodiment of this invention.

FIG. 3 is a schematic diagram showing an exemplary layout of the dummy cell pattern in accordance with one embodiment of this invention. For the sake of simplicity, merely three rows of dummy cell pattern of the array are demonstrated, however, it is understood that other patterns or arrays composed of the dummy cell patterns may be employed. As shown in FIG. 3, the dummy cell pattern 200 may be a rectangular region with a length L ranging between 0.5 µm and 2 µm, and a width W ranging between 0.5 µm and 1.5 µm. It is to be understood to one person skilled in the art that the dummy cell pattern 200 may be of other shapes, for example, rhombus, triangle, polygon shapes, etc. The dummy cell pattern 200 comprises at least one dummy diffusion pattern 202 surrounded by a shallow trench isolation (STI) region 204. At least a dummy gate pattern 212, such as a polysilicon pattern, is disposed on the dummy diffusion pattern 202. The dummy gate pattern 212 may be strip shaped. The dummy diffusion pattern 202 and the dummy gate pattern 212 are partially overlapped. The dummy cell pattern 200 further comprises a dummy gate pattern 214, such as a polysilicon pattern, directly on the STI region 204. The dummy gate pattern 214 may be strip shaped. The dummy gate pattern 214 does not overlap with the dummy diffusion pattern 202. According to the embodiment of this invention, the dummy gate pattern 212 is in parallel with the dummy gate pattern 214. Two ends of the dummy gate pattern 212 extend above the STI region 204 thereby forming overlapping areas C1 and C2. The dummy gate pattern 214 is directly on the trench isolation pattern, thereby forming an overlapping area C between the dummy gate pattern 214 and the STI region 204. According to the embodiment of this invention, the combination of C1, C2 and C is about 5%-20% of the predetermined regain A. Further, according to the embodiment of this invention, the three rows of dummy cell patterns in FIG. 3 are arranged in a staggered manner. For example, the dummy cell patterns in the first row R1 are not aligned with the dummy cell patterns in the second row R2 in the same direction, and the dummy cell patterns in the second row R2 are not aligned with the dummy cell patterns in the third row R3 in the same direction.

Figure 4:
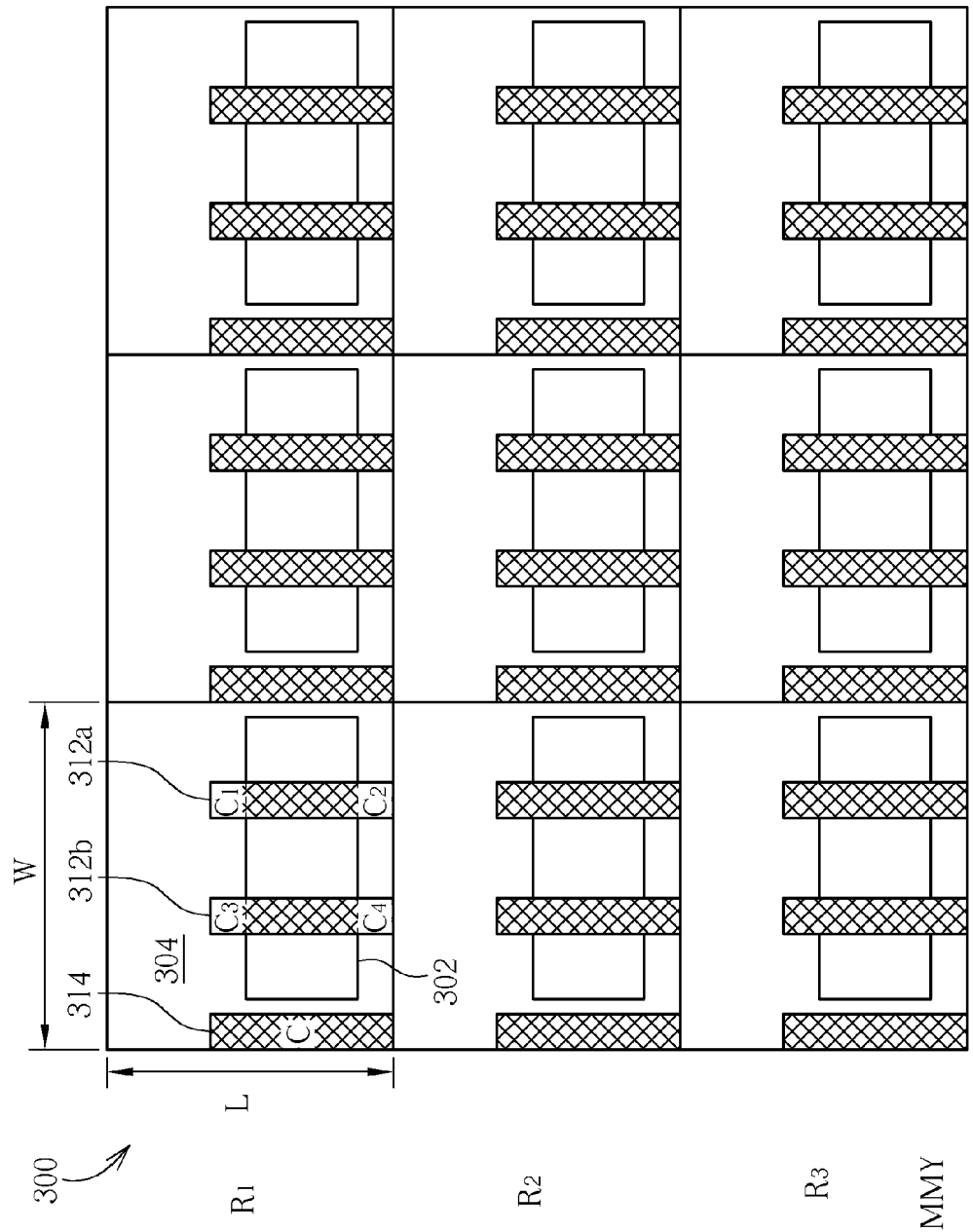
FIG. 4 is a schematic diagram showing an exemplary layout of the dummy cell pattern in accordance with another embodiment of this invention.

FIG. 4 is a schematic diagram showing an exemplary layout of the dummy cell pattern in accordance with another embodiment of this invention. For the sake of simplicity, merely three rows of dummy cell pattern of the array are demonstrated, however, it is understood that other patterns or arrays composed of the dummy cell patterns may be employed. As shown in FIG. 4, the dummy cell pattern 300 may be a rectangular region with a length L ranging between 0.5 µm and 2 µm, and a width W ranging between 0.5 µm and 1.5 µm. It is to be understood to one person skilled in the art that the dummy cell pattern 300 may be of other shapes, for example, rhombus, triangle, polygon shapes, etc. The dummy cell pattern 300 comprises at least one dummy diffusion pattern 302 surrounded by a shallow trench isolation (STI) region 304. At least a first dummy gate pattern 312a and a second dummy gate pattern 312b, such as a polysilicon patterns, are disposed on the dummy diffusion pattern 302. The first and second dummy gate patterns 312a and 312b may be strip shaped. The first and second dummy gate patterns 312a/312b and the dummy diffusion pattern 302 are partially overlapped. The dummy cell pattern 300 further comprises a dummy gate pattern 314, such as a polysilicon pattern, directly on the STI region 304. The dummy gate pattern 314 may be strip shaped. The dummy gate pattern 314 does not overlap with the dummy diffusion pattern 302. According to the embodiment of this invention, the dummy gate patterns 312a/312b are in parallel with the dummy gate pattern 314. Two ends of the dummy gate pattern 312a extend above the STI region 304 thereby forming overlapping areas C1 and C2. Two ends of the dummy gate pattern 312b extend above the STI region 304 thereby forming overlapping areas C3 and C4. The dummy gate pattern 314 is directly on the STI region 304, thereby forming an overlapping area C between the dummy gate pattern 314 and the STI region 304. According to the embodiment of this invention, the combination of C1~C4 and C is about 5%-20% of the predetermined regain A. Further, according to the embodiment of this invention, the three rows of dummy cell patterns in FIG. 3 are arranged in an aligned manner. For example, the dummy cell patterns in the first row R1 are aligned with the dummy cell patterns in the second row R2 in the same direction, and the dummy cell patterns in the second row R2 are aligned with the dummy cell patterns in the third row R3 in the same direction.

Figure 5:
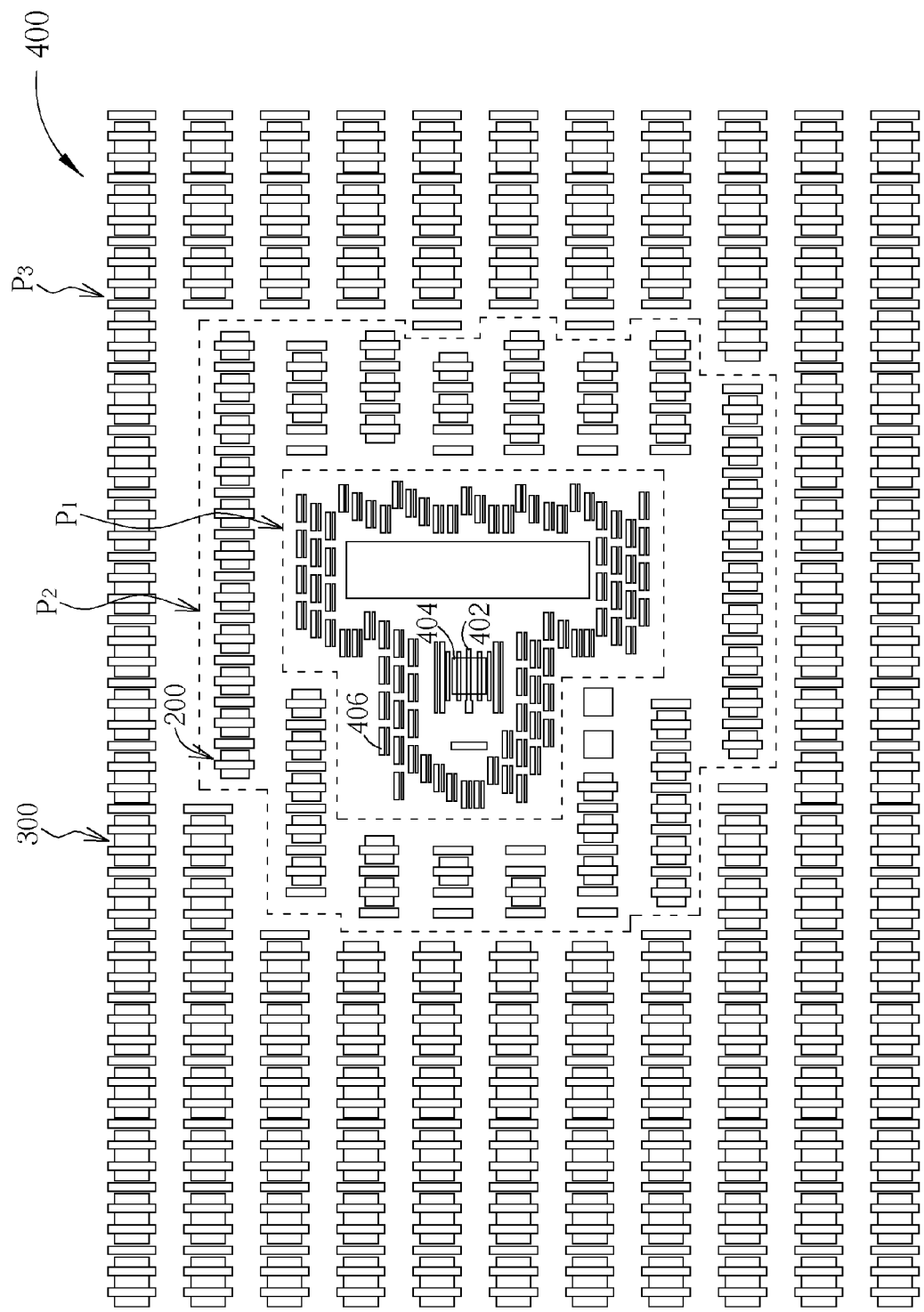
FIG. 5 is a schematic, partial layout diagram of an integrated circuit chip according to another embodiment of this invention.

FIG. 5 is a schematic, partial layout diagram of an integrated circuit chip according to another embodiment of this invention. As shown in FIG. 5, the layout 400 comprises a circuit element disposal region P1 having therein at least a gate pattern 402, an active area pattern 404 and assisting patterns 406 around the gate pattern 402. A first field P2 is defined as an annular region that surrounds the circuit element disposal region P1. Within the first field P2, a plurality of dummy cell patterns 200 as set forth in FIG. 3 are provided. The plurality of dummy cell patterns 200 may be arranged in a staggered manner. A second field P3 is defined as the open area that surrounds the first field P2. Within the second field P3, a plurality of dummy cell patterns 300 as set forth in FIG. 4 are provided. The plurality of dummy cell patterns 300 may be arranged in an aligned manner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dummy cell pattern for improving device thermal uniformity, comprising:
   a dummy diffusion pattern disposed within a predetermined region A;
   a trench isolation pattern encompassing the dummy diffusion pattern in the predetermined region A, wherein the trench isolation pattern is a shallow trench isolation (STI) region, the dummy diffusion pattern is entirely surrounded by the STI region, and the length and the width of the STI region are equal to the length and width of the predetermined region A;
   at least a first dummy gate pattern disposed on the dummy diffusion pattern with two ends of the first dummy gate pattern extending above the trench isolation pattern, thereby forming overlapping areas C1 and C2, wherein two ends of the first dummy gate pattern forming the overlapping areas C1 and C2 are disposed entirely on the STI region inside the predetermined region A; and
   a second dummy gate pattern directly on the trench isolation pattern forming an overlapping area C therebetween, wherein the second dummy gate pattern is disposed entirely on the STI region inside the predetermined region A and the combination of C1, C2 and C is about 5%-20% of the predetermined region A.

2. The dummy cell pattern for improving device thermal uniformity according to claim 1 wherein the predetermined region A has a shape selected from the group consisting of rectangular shape, rhombus shape, triangle shape and polygon shape.

3. The dummy cell pattern for improving device thermal uniformity according to claim 1 wherein the first dummy gate pattern and the second dummy gate pattern are strip shaped.

4. The dummy cell pattern for improving device thermal uniformity according to claim 3 wherein the first dummy gate pattern is in parallel with the second dummy gate pattern.

5. The dummy cell pattern for improving device thermal uniformity according to claim 1 wherein the first dummy gate pattern and the second dummy gate pattern are polysilicon patterns.

6. The dummy cell pattern for improving device thermal uniformity according to claim 1 wherein the second dummy gate pattern does not overlap with the dummy diffusion pattern.

7. The dummy cell pattern for improving device thermal uniformity according to claim 1 wherein the predetermined region A is a rectangular region with a length L ranging between 0.5 µm and 2 µm, and a width W ranging between 0.5 µm and 1.5 µm.

8. The dummy cell pattern for improving device thermal uniformity according to claim 1 further comprising a third dummy gate pattern disposed between the first dummy gate pattern and the second dummy gate pattern.

9. The dummy cell pattern for improving device thermal uniformity according to claim 8 wherein the third dummy gate pattern is disposed on the dummy diffusion pattern with two ends of the first dummy gate pattern extending above the trench isolation pattern, thereby forming overlapping areas C3 and C4.

10. The dummy cell pattern for improving device thermal uniformity according to claim 9 wherein the combination of C1~C4 and C is about 5%-20% of the predetermined region A.

* * * * *